United States Patent
Akahane et al.

(10) Patent No.: US 6,851,015 B2
(45) Date of Patent: Feb. 1, 2005

(54) METHOD OF OVERWRITING DATA IN NONVOLATILE MEMORY AND A CONTROL APPARATUS USED FOR THE METHOD

(75) Inventors: Fumihiko Akahane, Nagano (JP); Tsutomu Baba, Nagano (JP)

(73) Assignee: Sankyo Seiki Mfg. Co., Ltd., Nagano (JP)

( * ) Notice: Subject to any disclaimer, the term of this patent is extended or adjusted under 35 U.S.C. 154(b) by 206 days.

(21) Appl. No.: 10/152,206

(22) Filed: May 20, 2002

(65) Prior Publication Data

US 2002/0199054 A1 Dec. 26, 2002

(30) Foreign Application Priority Data

May 22, 2001 (JP) ....................................... 2001-153139

(51) Int. Cl.[7] .............................................. G06F 12/00
(52) U.S. Cl. ..................... 711/103; 711/154; 711/155; 711/162; 711/165; 714/6; 714/52; 714/54; 714/746; 714/758; 714/768; 714/773; 365/228
(58) Field of Search ................................ 711/103, 154, 711/155, 162, 165; 714/6, 52, 54, 746, 758, 768, 773; 365/228

(56) References Cited

U.S. PATENT DOCUMENTS

| | | | | |
|---|---|---|---|---|
| 5,485,595 A | * | 1/1996 | Assar et al. ................ 711/103 |
| 5,535,369 A | * | 7/1996 | Wells et al. ................ 711/171 |
| 5,544,356 A | * | 8/1996 | Robinson et al. .......... 707/205 |
| 5,598,370 A | * | 1/1997 | Niijima et al. ......... 365/185.33 |
| 5,630,093 A | * | 5/1997 | Holzhammer et al. ...... 711/115 |
| 5,717,886 A | * | 2/1998 | Miyauchi .................... 711/103 |
| 5,734,816 A | * | 3/1998 | Niijima et al. ................. 714/8 |
| 5,907,856 A | * | 5/1999 | Estakhri et al. ............. 711/103 |
| 5,933,368 A | * | 8/1999 | Ma et al. ................ 365/185.33 |
| 6,145,051 A | * | 11/2000 | Estakhri et al. ............. 711/103 |
| 6,237,110 B1 | * | 5/2001 | Lin et al. ........................ 714/7 |
| 6,532,529 B1 | * | 3/2003 | Hongo ........................ 711/220 |

FOREIGN PATENT DOCUMENTS

JP          07-219860          8/1995   ........... G06F/12/16

* cited by examiner

*Primary Examiner*—Stephen Elmore
(74) *Attorney, Agent, or Firm*—Reed Smith LLP

(57) ABSTRACT

In a nonvolatile memory such as flash memory where data is stored sector by sector, a method of overwriting a data sector is provided. The old data to be overwritten in a data sector along with its error detection code are initially saved to a backup region which is also in a non-volatile area. The old data in the data sector is then erased and new data along with its own error detection code are written into the same data sector where the old data was previously stored. When a power outage occurs during the overwrite process, error checking is performed to determine whether the data in the data sector is valid using the associated error detection code. Because the old data is saved in a non-volatile area, even if such unexpected power outage occurs during the overwrite process and the data in the data sector is determined to be invalid, at least the old data can be recovered from the non-volatile backup region which is not affected by the power outage.

11 Claims, 4 Drawing Sheets

PRIOR ART

METHOD OF OVERWRITING DATA IN NONVOLATILE MEMORY AND A CONTROL APPARATUS USED FOR THE METHOD

CROSS-REFERENCE TO RELATED APPLICATIONS

This application claims priority of Japanese application No. 2001-153139, filed May 22, 2001, the complete disclosure of which is hereby incorporated by reference.

BACKGROUND OF THE INVENTION a) Field of the Invention

The present invention relates to a method of overwriting nonvolatile memory data and a control apparatus used for the method. More specifically, the present invention relates to a method of overwriting data in such a way that data saved in nonvolatile memory is protected and a control apparatus is used for the method.

b) Description of the Related Art

Lately, flash memory capacity has increased dramatically along with an exponential improvement in useable lifetime in terms of the number of times data in flash memory can be overwritten. By these advances, flash memory serves not only as the conventional coding program storage (medium), being overwritten less frequently, but also as nonvolatile memory, being overwritten very frequently.

Flash memory has a unique property that affects the overwriting method: when one wants to write the bit data "1" over "0", one must first erase all data in a sector to which the data to be overwritten (in logic, the target bit data is set to "1"). It is impossible to pin-pointedly erase data in a sector. For this reason, flash memory data is conventionally overwritten in the following manner (See FIG. 4).

First of all, prior to complete erasure of data in a sector containing data to be overwritten, a work area mapped in volatile memory such as random access memory (hereafter referred to as RAM) is prepared; data within the range to be erased is copied for security (Step 101, S101). Then, the data to be overwritten (edited) is overwritten (edited) in the work area (Step 102, S102). The corresponding sector in flash memory is erased (Step 103, S103). The post-overwrite data on the work area is written in the erased sector (Step 104, S104). Overwriting is thus completed.

However, erasing flash memory often requires erasure of entire data in a sector at first, requiring relatively long process time (e.g. seconds) compared to other processes. The sector size of flash memory varies from multiples of ten bits to multiples of 10,000 bits depending on the product type. Some types of flash memory take about 15 seconds from start to completion of erasure.

For this reason, an interruption of power supply, if it occurs unexpectedly between the erasure of data in flash memory and the completion of writing the post-overwrite data, interrupts control of flash memory, causing loss of data saved on RAM, volatile memory; one may be seriously concerned with irrevocable loss of very important data.

Conventionally, to overcome this problem, a power interruption detection circuit, and a backup power supply, supplying auxiliary power at the time of complete power outage, have been employed.

Problems the Present Invention Intends to Solve

Nonetheless, addition of a hardware device such as a backup power supply, if it is installed to protect important data in flash memory from power outage, increases the cost of manufacturing the product of interest. In addition, installing a backup power supply on a product of interest, so as to sufficiently complement the maximum value required for the duration of erasure of flash memory, may require modification of the shape of a product of interest. Moreover, if a battery is utilized as a backup power (hardware prevention measure) supply during power outage, power will not be supplied if the battery is not sufficiently charged. The use of a battery thus requires another mechanism for sensing whether the battery is charged well in advance.

OBJECT AND SUMMARY OF THE INVENTION

Considering the above, the primary object of the present invention is to provide a method of overwriting data in nonvolatile memory and a control apparatus for using the method. Specifically, the present invention provides a method of overwriting pre-overwrite data, which is the data to be overwritten, with post-overwrite data, which is the new data that overwrites the pre-overwrite data.

A method of overwriting nonvolatile memory data in which data of interest is stored sector by sector, in a first aspect of the invention provides a backup region having at least the same memory capacity as the sector to which data to be overwritten belongs such that, when overwriting the data of interest, pre-overwrite data in the sector to which the data to be overwritten belongs is first written in the backup region, then, data to be overwritten is erased from the sector; post-overwrite data is then written in the sector together with an error detection code for the post-overwrite data.

A method of overwriting nonvolatile memory data in which the data of interest is stored sector by sector, in a second aspect of the invention, utilizing a backup region having at least the same memory capacity as the sector to which data to be overwritten belongs such that, when overwriting the data of interest, data in the sector to which the data to be overwritten belongs is first written in the backup region, then, data to be overwritten in the sector is deleted; post-overwrite data is then written in the sector together with an error detection code for the post-overwrite data.

Therefore, even if a power outage occurs during overwriting of data in nonvolatile memory, the nonvolatile memory can at least recover its original state after power is regained by the steps comprising: determining whether the data to be overwritten in the sector of interest is correct data or erroneous data utilizing an error detection code; if the sector to be overwritten contains erroneous data, pre-overwrite data stored in the backup region is copied once again in the sector of interest.

The invention, in a further aspect, operates as follows: in the method of overwriting data in nonvolatile memory as first set forth above wherein, when the pre-overwrite data is written in the backup region, a pre-overwriting data error detection code is written in the backup region. Therefore, prior to copying pre-overwrite data stored in the backup region once again into the sector to be overwritten, whether the data in the backup region is correct or erroneous data can be determined.

The invention as set forth in a still further aspect operates as follows: a method of overwriting data in nonvolatile memory as set forth as first described above wherein the backup region is a backup sector provided in the nonvolatile memory having the same memory capacity as the sector to which the required data belongs. In this case, the method does not require a separate backup data storage medium, thereby providing a cost effective backup region.

The invention as set forth in a still further aspect operates as follows: a method of overwriting data in nonvolatile memory as set forth as first described above wherein the nonvolatile memory is flash memory. As a result, even when unexpected power outage occurs during overwriting of data in flash memory, requiring all the data in the sector to which data to be overwritten belongs, the nonvolatile memory can recover at least its original state, which is before overwriting the data. dr

DESCRIPTION OF THE PREFERRED EMBODIMENTS

Figure 1:
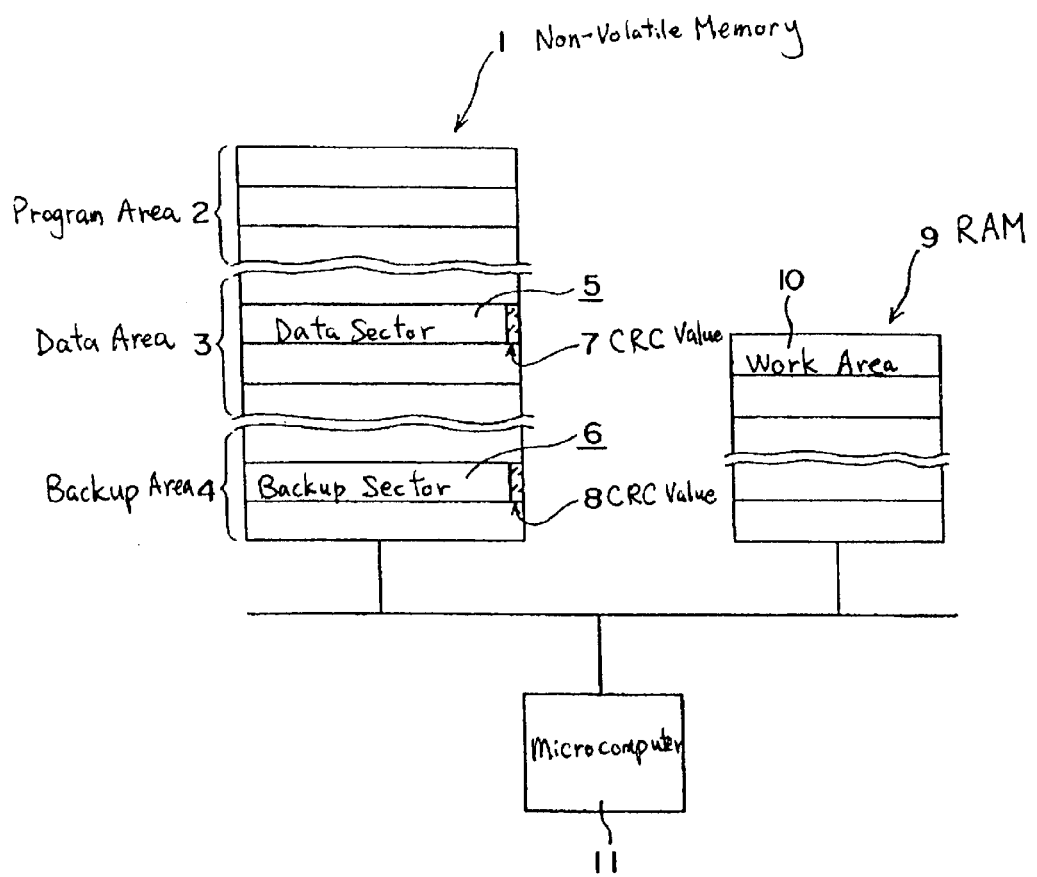
FIG. 1 is a schematic configuration of one of the embodiments of the nonvolatile memory control apparatus according to the present invention.

The present invention is described in detail with reference to embodiments shown in the drawings referenced herein.

Figure 2:
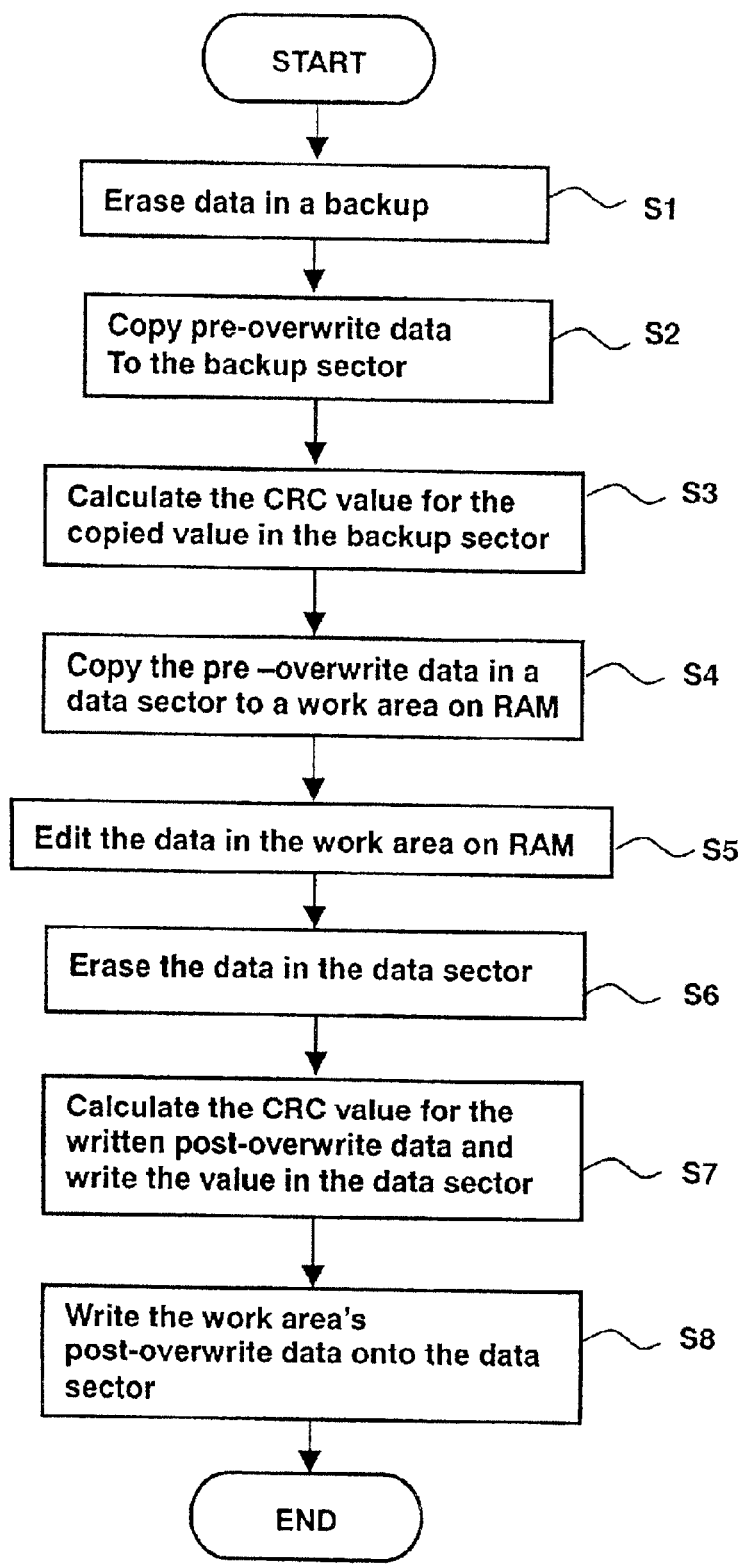
FIG. 2 is a flow chart showing an example of a process of overwriting data in nonvolatile memory according to the present invention.
Figure 3:
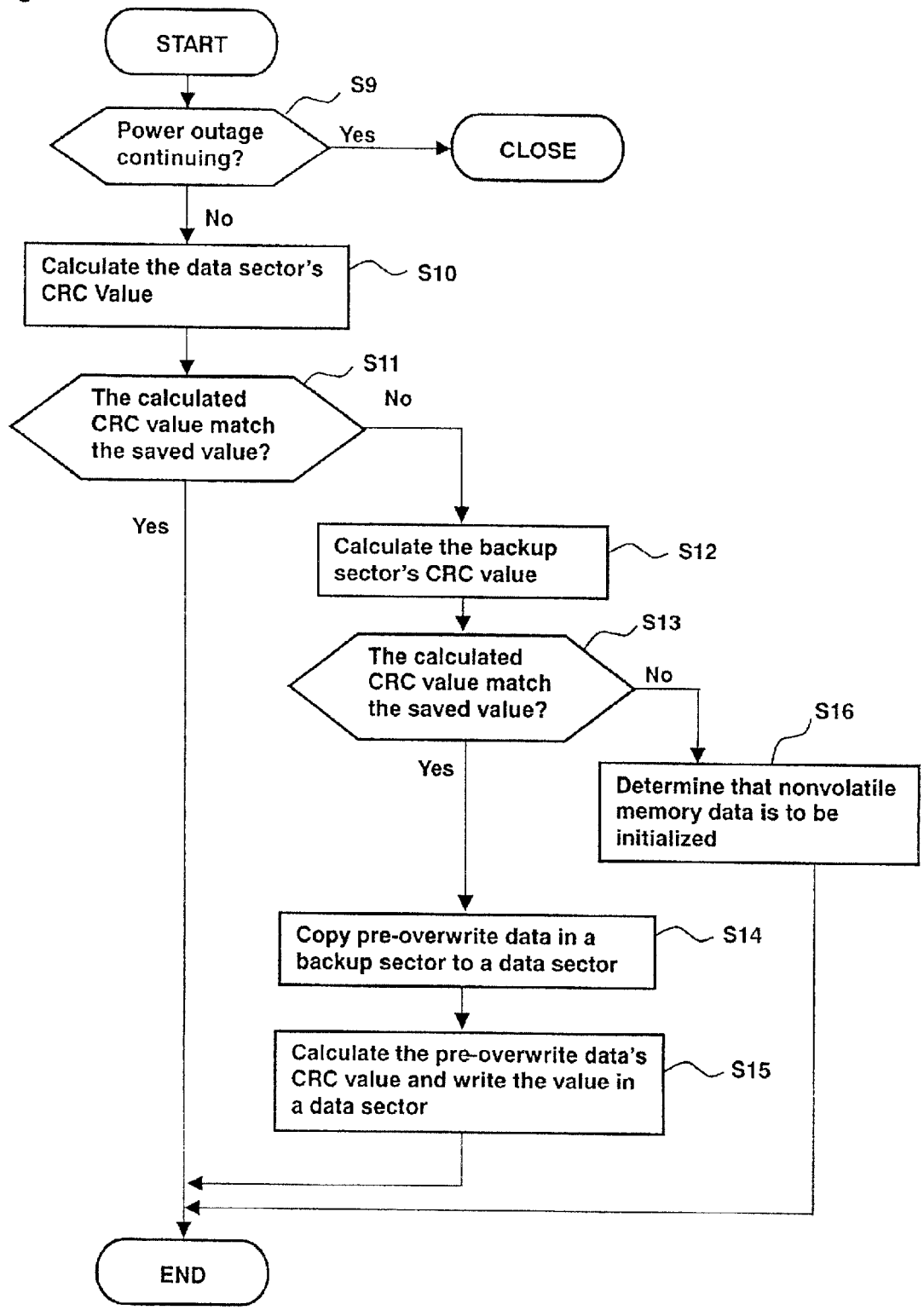
FIG. 3 is a flow chart showing an example of another process of overwriting data in nonvolatile memory according to the present invention.
Figure 4:
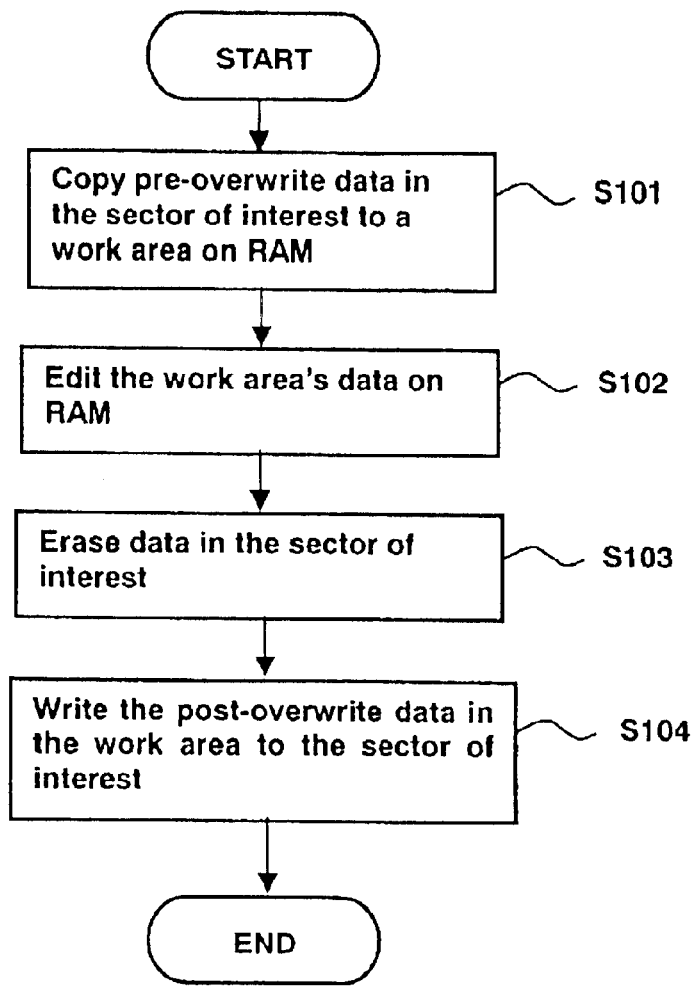
FIG. 4 is a flow chart showing an example of a process of overwriting data in flash memory of conventional technology.

FIGS. 1–3 show Embodiment 1 of a method of overwriting data in nonvolatile memory and a control apparatus for using the method. The method of the present invention overwrites data in nonvolatile memory 1 in which required data are stored sector by sector, and provides a backup region 6 having the same memory capacity as sector 5 to which data to be overwritten belongs. When overwriting the data of interest in nonvolatile memory 1, pre-overwrite data in sector 5, to which the data to be overwritten belongs, is written in backup region 6, then, the data to be overwritten is erased from sector 5; post-overwrite data is then written in sector 5 together with an error detection code for detecting error in post-overwrite data.

In this embodiment, when writing the pre-overwrite data in backup region 6, an error detection code for pre-overwrite data is also written in backup region 6 for example.

In this embodiment, for example, backup region 6 also backup sector 6 provided in nonvolatile memory 1 has the same memory capacity, as sector 5 containing the data of interest.

In addition, nonvolatile memory 1 of the present invention, for example, is a flash memory. Nonvolatile memory is referred to as flash memory 1 hereafter.

The method of the present invention can be written as a program, for example, to be connected to flash memory 1, such that microcomputer 11 can execute the program to read-out from or write to flash memory 1. The control apparatus for flash memory 1 is thus actualized. Microcomputer 11 and flash memory 1 may be connected via bus, for example. RAM 9 for editing data, for example, may be connected to the bus (See FIG. 1).

The memory region of flash memory 1 of this embodiment comprises, for example, program area 2, data area 3, and backup area 4.

Program area 2 comprises a single or multiple sectors and stores one type of program codes that control microcomputer 1, being first loaded upon resetting of microcomputer 1 to provide the required control, and another type of program code that executes the method of the present invention. Program area 2 is never erased in this embodiment.

Data area 3 is a memory region in which the data of interest is recorded. This area comprises single or multiple sectors in which the data of interest can be overwritten, when it is required. In this embodiment, sector in data area 3 is called data sector 5.

Backup area 4 is a memory region for copying pre-overwrite data for backup purposes before overwriting the data in data area 3. In this embodiment, backup area 4 in flash memory 1 which provides the data area 3 is given for example the same memory size (capacity) as data area 3. In the present invention, a sector in backup area 4 is called backup sector 6. Note that backup sector 6 and data sector 5 are also given the same memory size (capacity) in this embodiment.

Also, in this embodiment, an error detection code is written in data area 3 and backup area 4 so as to check whether the data in data area 3 or backup area 4 contains erroneous data. In this embodiment, block-check character (BCC), for example, is written in each sector in data area 3 and backup area 4. As for BCC, a known technique such as the cyclic redundancy check (CRC) technique may be used. A region for writing the CRC value must be provided in data area 3 and each sector in backup area 4.

A control apparatus for flash memory 1 shown in FIG. 1 overwrites data by the steps shown, for example, in FIG. 2. First, prior to copying data to be overwritten to data sector 5, data in backup sector 6 is erased (Step 1, S1). Then, the control apparatus copies pre-overwrite data in data sector 5 to backup sector 6 (Step 2, S2). The control apparatus also computes the CRC value for pre-overwrite data copied in backup sector 6 and write the value in backup sector 6 (Step 3, S3; also see Reference Symbol 7 in FIG. 1). The control apparatus copies pre-overwrite data in data sector 5 to work area 10 on RAM 9 (Step 4, S4). Next, the control apparatus edits the data of interest in work area 10 on RAM 9 (Step 5, S5). Prior to writing the post-overwrite data in work area 10, the control apparatus erases the data in data sector 5 (Step 6, S6). Then, the control apparatus writes the post-overwrite data in work area 10 onto data sector 5 (Step 7, S7). The apparatus further compute the CRC value for the post-overwrite data written in data sector 5 and writes the CRC value onto the data sector 5 (Step 8, S8; see Reference Symbol 8 in FIG. 1).

By executing the above-mentioned data overwriting process, even if unexpected power outage occurs during the abovementioned data processing, together with execution of the data recovery process described in the flow chart in FIG. 3, for example, the pre-overwrite data in flash memory 1 can recover at least its pre-overwrite state.

In other words, once power supply is discontinued and if the power source is regained or an operator turns on the switch to supply power again (FIG. 3, Step 9, S9; No); first, the CRC value in data sector 5 is computed (FIG. 3, Step 10, S10), and then, the computed CRC value and the CRC value recorded in the data sector 5 are compared (FIG. 3, Step 11, S11) to each other. If these CRC values match (FIG. 3, Step 11, S11; Yes), the data in data sector 5 is correct, which means that the data in the data sector 5 was not overwritten, or data was completely overwritten at the time power outage occurred, requiring no recovery process.

In contrast, if these CRC values do not match (FIG. 3, Step 11, S11; No), data sector 5 contains an error: it is presumed that data was overwritten inaccurately due to power outage that occurred during erasure of the data in data sector 5 (FIG. 2, Step 6, S6), during writing of the post-overwrite data in data sector 5 (FIG. 2, Step 7, S7), or during writing of the computed CRC value in data sector 5 (FIG. 2, Step 8, S8).

To solve the problem, the CRC value of pre-overwrite data recorded in backup sector 6 is computed (FIG. 3, Step 12, S12), and then, the computed CRC value and the CRC value recorded in backup sector 6 are compared to each other (FIG. 3, Step 13, S13). If the CRC values match (FIG. 3, Step 13, S13; Yes), it is confirmed that the pre-overwrite data in backup sector 6 is correct. The control apparatus, then, copies the pre-overwrite data recorded in backup sector 6 to corresponding data sector 5 (FIG. 3, Step 14, S14).

Then, the control apparatus computes the CRC value of the pre-overwrite data written in data sector 5 and write the CRC value in data sector 5 (FIG. 3, Step 15, S15) such that, next time when power is turned on, the control apparatus can tell that the pre-overwrite data in data sector 5 is normal due to the recovery process provided through these steps.

Occurrence of unexpected power outage, for example, during erasing backup sector 6 (FIG. 2, Step 1, S1), during copying of pre-overwrite data in backup sector 6 (FIG. 2, Step 2, S2), or during writing of computed CRC value in corresponding backup sector (FIG. 2, Step 3, S3) can cause an error in backup sector 6. Nonetheless, at the point of power outage, the step such as erasing the data in data sector 5 (FIG. 2, Step 6, S6), writing the post-overwrite data in corresponding data sector 5 (FIG. 2, Step 7, S7), or computing the CRC value and writing the computed CRC value in corresponding data sector 5 (FIG. 2, Step 8, S8) has not been executed. As a result, the power outage does not affect data in data sector 5. Therefore, the CRC value in data sector 5 usually matches the computed CRC value (FIG. 3, Step 11, S11; No), and the CRC value in backup sector 6 usually matches the computed CRC value (FIG. 13, Step 13, S13; No). Knowing this, whenever the CRC value in data sector 5 does not match the computed CRC value (FIG. 3, Step 11, S11; No) and the CRC value in backup sector 6 value does not match the computed CRC value (FIG. 3, Step 13, S13; No) in this embodiment, the control apparatus determines this unmatched situation as an indication of an irrevocable error, and further determines that the data on flash memory 1 must be, for example, initialized (FIG. 2, Step 16, S16).

As described, according to the present invention, even though power outage occurs unexpectedly during overwriting of data in flash memory 1, data in flash memory 1 can restore at least its state before overwriting. The worst-case scenario, in which important data is lost, irrevocably is thus avoided.

In addition, the present invention can be easily actualized by means of software, eliminating the need for addition of hardware such as a backup power source. Moreover, the present invention protects data in flash memory 1 independent from, for example, the charged state (sufficiently charged or not) of a battery installed in the apparatus to which the present invention is applied. This eliminates the need for a mechanism for checking whether a battery is sufficiently charged. In other words, elimination of the need for hardware while maintaining good reliability provides a significant reduction in manufacturing cost of the apparatus of interest. Also the present invention eliminates the need for modifying the shape of the apparatus of interest that would have been required if hardware was added.

The present invention does not limit its embodiments to the abovementioned embodiment although it is one of the preferred embodiments. The embodiments can be modified in various ways as long as the spirit of the present invention is maintained.

Assume that one has data to be overwritten and compares the data values obtained before and after overwriting on a bit basis. If all bits that were "1" turn out to be "0," only the data requiring a change can be overwritten, rather than going through the erasure step, provided that the function of flash memory 1 allows it.

In addition, nonvolatile memory 1 is not limited to flash memory. For example, other overwritable nonvolatile memory such electrically erasable programmable read only memory (EEPROM) or ferroelectric random access memory (FRAM) may also be used.

Backup region 6 is not limited to be formed within flash memory 1 having data requiring overwriting. It can be formed, for example, in a separate flash memory. Also, backup sector 6 or backup area 4 is not limited to those having the same memory capacity as data sector 5 or data area 3. Backup region 6 or backup area 4 may have a larger memory capacity than data sector 5 or data area 3.

Moreover, the error detection code is not limited to CRC but can be an alternate error detection code.

The abovementioned invention can be applied to a card reader, for example, which reads and writes the data from/to a card. In a card reader mechanism controlled by software, data required for eliminating equipment-to-equipment deviations derived from hardware components might be manually measured at the time of assembling the equipment or automatically measured utilizing a self-adjustment function to obtain a "calibration value". This calibration value may be written in flash memory (Flash ROM) and may be overwritten by the abovementioned method.

The present invention may be built into a client's system, if required, so as to overwrite the data in flash memory. The system adopting the present invention can maintain its normal operation after experiencing power outage.

Advantageous Effects of the Present Invention

In a method of overwriting nonvolatile memory data in which the data of interest is stored sector by sector, the invention as first set forth above, the nonvolatile memory control apparatus as further set forth above provides a backup region having at least the same memory capacity as the sector to which data to be overwritten belongs such that, when overwriting the data of interest, pre-overwrite data in the sector to which data to be overwritten belongs is first written in the backup region, then, data to be overwritten is erased from the sector; post-overwrite data is then written in the sector together with an error detection code for the post-overwrite data. As a result, even if power outage occurs during overwriting of data, the nonvolatile memory can recover at least its original (before overwriting) state. The worst-case scenario that important data is lost irrevocably is thus avoided.

In addition, the present invention protects data in nonvolatile memory independent from the charged level (sufficiently charged or not) of a battery installed in the apparatus of interest, eliminating the need for a mechanism to check whether a battery is sufficiently charged or not. The present invention also eliminates the need for addition of hardware such as a backup power source as well. This elimination of unwanted hardware while maintaining excellent reliability of data protection makes possible a significant reduction in manufacturing cost. Moreover, the present invention also eliminates the need for modification of the shape of the apparatus of interest that would have been required to house additional hardware.

The method of overwriting data in nonvolatile memory as set forth in a further aspect determine whether the data in the backup region contains correct data or erroneous data, prior to writing the pre-overwrite data in the backup region back into the sector containing the data to be overwritten, utilizing the error detection code.

The method of overwriting data in nonvolatile memory as set forth in yet another aspect can provide a cost effective backup region, eliminating the need for having a separate backup data storage media.

The method of overwriting data in nonvolatile memory as set forth in a still further aspect utilizes flash memory for nonvolatile memory. Even though flash memory requires erasure of entire data in a sector to which data to be overwritten belongs, the flash memory recovers at least to its original (before overwriting) state after it experiences an unexpected power outage during overwriting of data, The worst-case scenario, of important data being lost irrevocably, can thus be avoided.

While the foregoing description and drawings represent the present invention, it will be obvious to those skilled in the art that various changes may be made therein without departing from the true spirit and scope of the present invention.

What is claimed is:

1. A method of overwriting nonvolatile memory data in which data of interest is stored sector by sector, comprising, when overwriting data of interest, the steps of:

providing a backup region having at least the same memory capacity as one sector in which data to be overwritten is stored, said backup region being provided in non-volatile memory;

writing in said backup region pre-overwrite data stored in said one sector in which data to be overwritten is stored along with an error detection code for said pre-overwrite data;

copying said pre-overwrite data to a volatile memory;

editing said pre-overwrite data stored in said volatile memory to produce post-overwrite data;

erasing said pre-overwrite data from said one sector;

then, writing in said one sector said post-overwrite data stored in said volatile memory together with an error detection code for said post-overwrite data; and upon restoration of power, determining whether the data in said one sector is valid using said error detection code.

2. The method of overwriting data in nonvolatile memory as set forth in claim 1 wherein said nonvolatile memory is flash memory.

3. The method of overwriting data in nonvolatile memory as set forth in claim 1, wherein the step of writing in said backup region pre-overwrite data includes calculating a CRC value for said pre-overwrite data and writing the calculated CRC value in said backup region.

4. The method of overwriting data in nonvolatile memory as set forth in claim 1, wherein the step of writing in said one sector said post-overwrite data includes calculating a CRC value for said post-overwrite data and writing the calculated CRC value in said one sector.

5. The method according to claim 4, further comprising:

overwriting the data stored in said one sector with the data stored in said backup region if the data in said one sector is determined to be invalid.

6. A method of overwriting nonvolatile memory data in which data of interest is stored sector by sector, comprising, when overwriting data of interest, the steps of:

providing a nonvolatile memory control apparatus that includes a non-volatile backup region having at least the same memory capacity as one sector in which data to be overwritten is stored;

writing in said backup region pre-overwrite data stored in the sector in which data to be overwritten is stored along with an error detection code for said pre-overwrite data;

copying said pre-overwrite data to a volatile memory;

editing said pre-overwrite data stored in said volatile memory to produce post-overwrite data;

erasing said data to be overwritten from said one sector;

then writing in said one sector said post-overwrite data stored in said volatile memory together with an error detection code for said post-overwrite data; and upon restoration of power, determining whether the data in the sector of interest is valid using said error detection code.

7. A method of overwriting pre-overwrite data stored in a nonvolatile memory with post-overwrite data in which data is stored sector by sector, comprising:

providing in a non-volatile memory a backup region and a data region having a plurality of data sectors in which a plurality of pre-overwrite data are stored, the backup region and data region being both provided in the non-volatile memory;

copying the pre-overwrite data stored in one of the data sectors along with an error detection code for the pre-overwrite data to the backup region;

erasing the pre-overwrite data stored in the one data sector; and writing the post-overwrite data in the one data sector where the pre-overwrite data was stored together with an error detection code for the post-overwrite data.

8. The method according to claim 7, prior to the step of erasing, further comprising:

copying the pre-overwrite data to a volatile memory; and editing the copied pre-overwrite data in the volatile memory to produce the post-overwrite data.

9. The method according to claim 7, further comprising:

upon restoration of power, determining whether the data in the one data sector is valid using the error detection code associated therewith.

10. The method according to claim 9, further comprising:

overwriting the data stored in the one data sector with the data stored in the backup region if the data in the one data sector is determined to be invalid.

11. The method according to claim 10, prior to the step of overwriting the data stored in the one data sector, further comprising:

if the data in the one data sector is determined to be invalid, determining whether the data stored in the backup region is valid using the error detection code associated therewith.

* * * * *